United States Patent
Shiu

(10) Patent No.: US 7,157,686 B2
(45) Date of Patent: Jan. 2, 2007

(54) OPTICAL RECEIVER

(75) Inventor: Yu-Hong Shiu, Nantou (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 360 days.

(21) Appl. No.: 10/419,805

(22) Filed: Apr. 22, 2003

(65) Prior Publication Data

US 2004/0108445 A1 Jun. 10, 2004

(30) Foreign Application Priority Data

Dec. 6, 2002 (TW) ............................... 91219828 U

(51) Int. Cl.
*H01L 29/18* (2006.01)

(52) U.S. Cl. ..................... 250/214.1; 257/294

(58) Field of Classification Search ............ 250/214 R, 250/214.1, 226; 257/294, 432, 435, 437, 257/458; 398/135–139
See application file for complete search history.

(56) References Cited

U.S. PATENT DOCUMENTS

| | | | |
|---|---|---|---|
| 6,483,161 B1 | 11/2002 | Kuhara et al. | |
| 6,614,479 B1 * | 9/2003 | Fukusho et al. | ............. 348/340 |
| 6,765,276 B1 * | 7/2004 | Fasen et al. | ................. 257/437 |
| 6,947,672 B1 * | 9/2005 | Jiang et al. | .................. 398/135 |
| 6,996,304 B1 * | 2/2006 | Aronson et al. | .............. 385/14 |

FOREIGN PATENT DOCUMENTS

| | | |
|---|---|---|
| DE | 102 03 875 A1 | 10/2002 |
| JP | 04206571 A * | 7/1992 |
| JP | 2002-314117 A | 10/2002 |

* cited by examiner

*Primary Examiner*—Stephone B. Allen
(74) *Attorney, Agent, or Firm*—Birch, Stewart, Kolasch & Birch, LLP

(57) ABSTRACT

An optical receiver is provided to receive light signals in a specific frequency range and transform into an electric current. The optical receiver has a photo diode with a sensitization area coated with an anti-reflection film and a filter film. The filter film allows a light of a specific frequency range to go through. In comparison with a filter lens used in prior arts, the optical receiver using the filter film has a comparatively smaller volume.

20 Claims, 3 Drawing Sheets

OPTICAL RECEIVER

BACKGROUND OF THE INVENTION

1. Field of the Invention

The invention generally relates to an optical receiver, and particularly, to an optical receiver applicable to optical fiber communication systems.

2. Related Art

Optical receivers play an important role in the field of optical fiber communication. An optical receiver receives the light transmitted through the optical fiber, transforms it into electric current corresponding to the intensity of the light. The optical receivers being currently used mainly include photo diodes. Photo diodes generally used in optical fiber communication are PIN photo diodes and avalanche photo diodes.

An optical receiver is usually designed for response only to a light of a specific frequency range. In order to prevent from detecting noise of other frequency and causing an error response, an optical receiver of prior arts uses a filter lens in front of the optical receiving portion of the photo diode. The lens is configured like receivers of general remote controls of electronic appliances. However, the filter lens has the following disadvantages when being applied in optical fiber communication:
a) Against the trend of minimizing the communication devices, the filter lens occupies much space and causes problem of space arrangement;
b) In the packaging of optical fiber communication device, the filter is hard to be fixed and makes the packaging more difficult;
c) The filter lens is sensitive to environmental conditions, easy to be damaged and shortened of its lifetime.

SUMMARY OF THE INVENTION

The object of the invention is to provide an optical receiver that can solve the problems of space arrangement, difficult packaging and short lifetime of conventional optical receivers.

An optical receiver according to the invention mainly includes a photo diode having a sensitization area coated with an anti-reflection film. A filter film is further coated on the surface of the anti-reflection film. The filter film allows a light of a specific frequency range to go through.

In comparison with a filter lens used in prior art, the optical receiver using the filter film makes the mechanism easier, has a longer lifetime and comparatively smaller volume.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1:
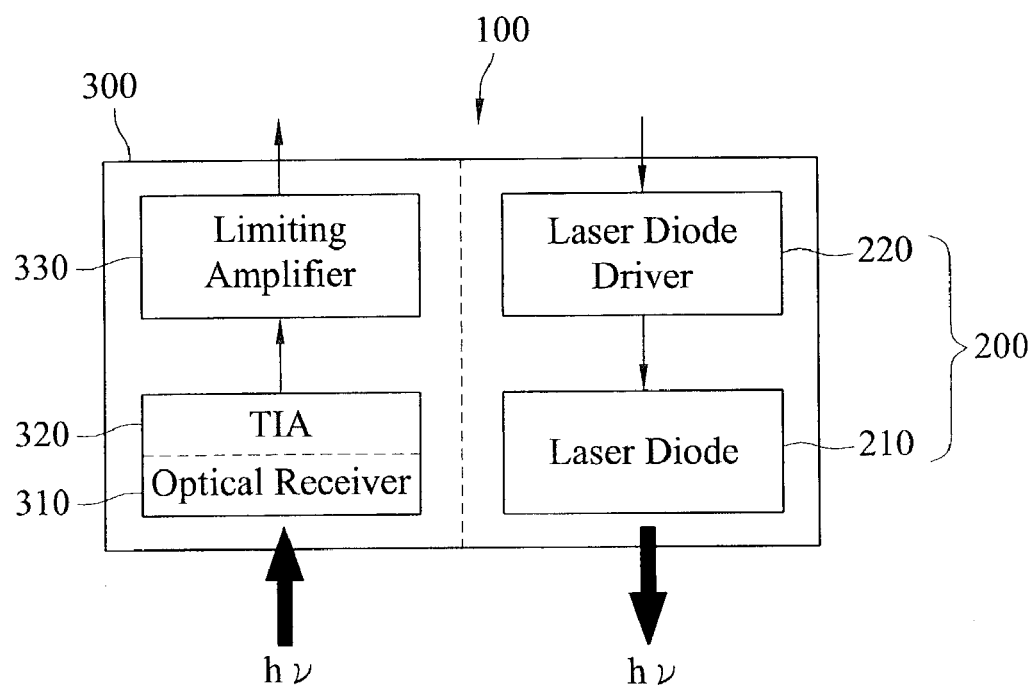
FIG. 1 is a systematic block diagram of a first embodiment of the invention.

As shown in FIG. 1, the first embodiment of the invention for an optical transceiver module 100 includes a light-emitting device 200 and a light-receiving device 300. The light-emitting device 200 is composed of a laser diode 210 and a laser diode driver 220. The laser diode 210 transforms electrical signals of the driver 220 into optical signals. The light-receiving device 300 includes an optical receiver 310, a transimpedance amplifier 320 and a limiting amplifier 330. The optical receiver 310 transforms optical signals into electric current. The transimpedance amplifier 320 transforms the current into voltage signals. The limiting amplifier 330 provides a low/high threshold to the voltage signals that a voltage lower than the threshold is outputted as logic zero; and a voltage higher than the threshold is outputted as logic one, so the signal decay through distant optical transmission can be recovered.

Figure 2:
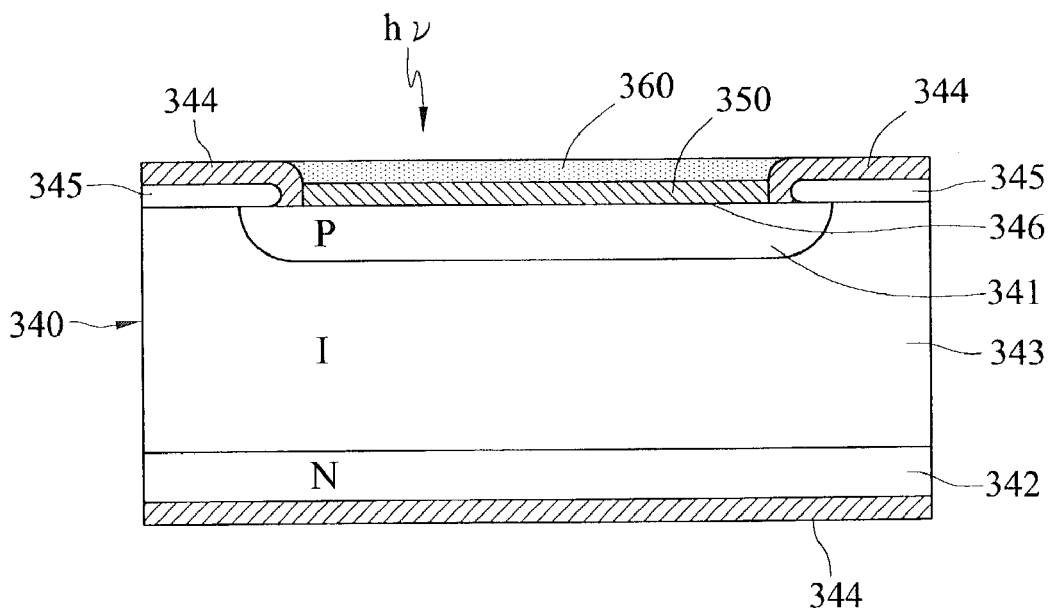
FIG. 2 is a constructional view of the first embodiment of the invention.

The structure of the optical receiver 310 is illustrated in FIG. 2. The optical receiver 310 includes a photo diode 340 with a sensitization area 346 coated with an anti-reflection film 350 and a filter film 360. In this embodiment, a PIN photo diode is constructed with a P-region 341, a N-region 342 and a thicker intrinsic region 343 located between the two. There are metal contacts 344 located outside the P-region 341 and the N-region 342. A silicon dioxide layer 345 is located between the metal contact 344 of the P-region 341 and the intrinsic region 343. A part of the P-region 341 without the metal contact 344 covered is the sensitization area 346 for sensing light signals. A reverse voltage (not shown on the drawing) is applied between the P-region 341 and N-region 342 so as to generate a high-density electric field for collecting electric charges generated from light stimulation and generating an electric current.

The anti-reflection film 350 covering the surface of the sensitization area 346 of the photo diode 340 prevents the incident beam of the photo diode 340 from coming out by reflection or refraction.

The filter film 360 is the characteristics of the embodiment. The filter film 360 covers the surface of the anti-reflection film 350 and allows only light of a specific frequency range to go through. For example, the filter film 360 allows only a light with wavelength of 1310 nm to pass when several lights of various frequencies coming along a multi-mode fiber.

In comparison with filter lens of prior arts, the filter film of the invention has the following advantages:
a) The parameters and conditions for manufacturing the filter film, and the frequency range of the filter film, are easier to be precisely controlled;
b) The filter film is more stable that it is not apt to be influenced by environmental conditions or caused of fatigue or transmutation;
c) It saves space so that the optical receiver and whole optical receiver module can be minimized;
d) No filter lens is needed, so the manufacturing cost and the technical problem of fixing the filter lens are prevented.

Figure 3:
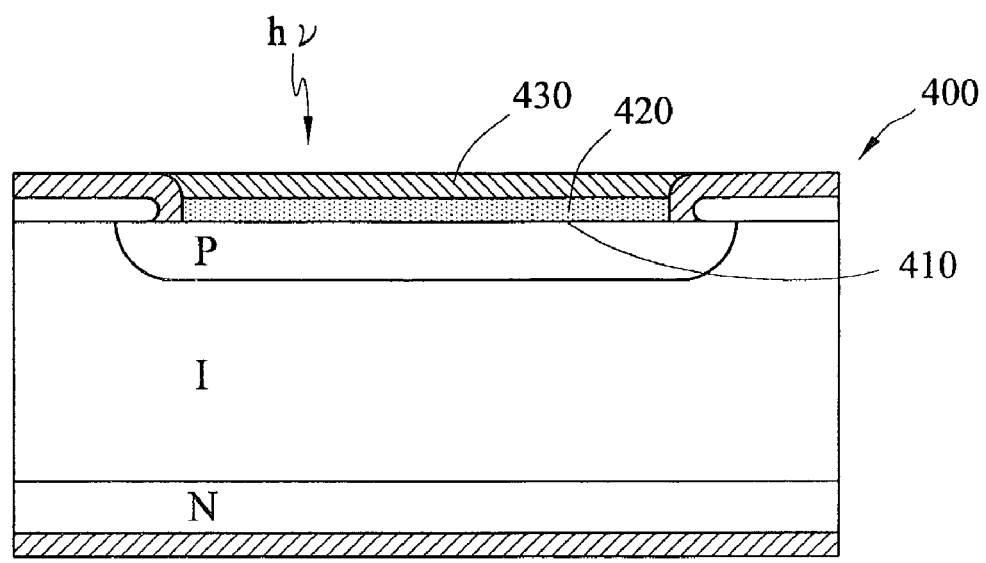
FIG. 3 is a constructional view of a second embodiment of the invention.

FIG. 3 shows a second embodiment of the invention. The positions of the anti-reflection film 430 and the filter film 420 are reversed with that of the first embodiment. The filter film 420 first covers the surface of a sensitization area 410 of the photo diode 400. Then, the anti-reflection film 430 covers the surface of the filter film 420.

Figure 4:
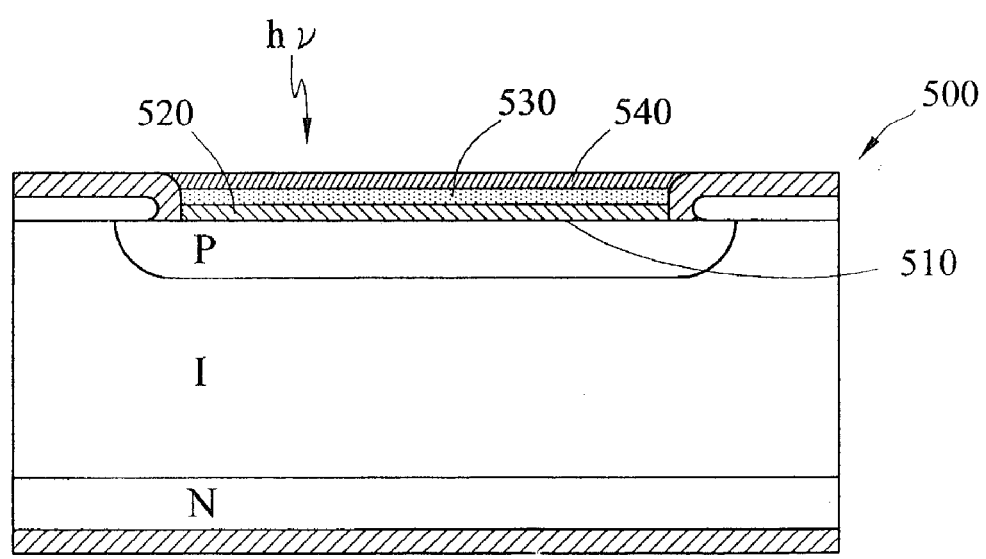
FIG. 4 is a constructional view of a third embodiment of the invention.

Practically, in order to achieve a narrower light frequency range, several layers of filter films have to be applied. As shown in FIG. 4, a third embodiment of the invention, on an anti-reflection film 520 that covers a sensitization area 510 of a photo diode 500, there are a first filter film 530 and a second filter film 540 applied orderly. The number of layers and the materials of the filter films depend on the requirements of the frequency range.

Figure 5:
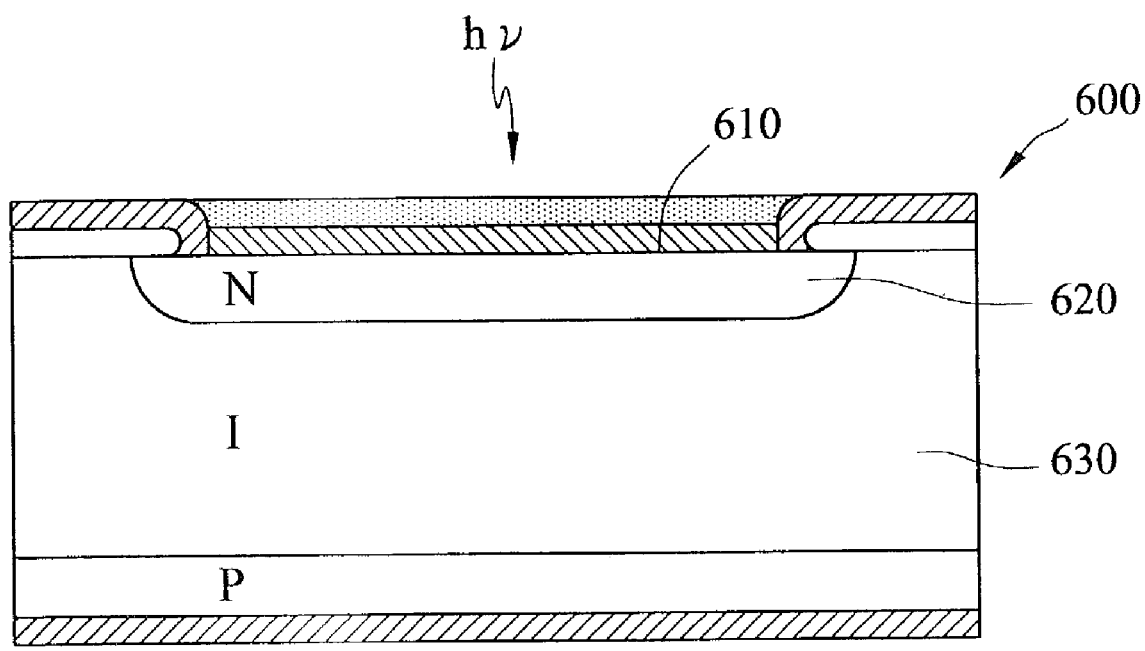
FIG. 5 is a constructional view of a fourth embodiment of the invention.

The filter film only has to cover the sensitization area wherever the sensitization area is. For example, in FIG. 5, a fourth embodiment of the invention, the optical receiver is almost the same as that of the first embodiment but the sensitization area 610 of the photo diode 600 is located at the N-region 620. The sensitization area 610 can also be at the intrinsic region 630. The detailed construction of such photo diode is of prior arts that are not described herein.

Though the aforesaid embodiments are all of PIN photo diodes, it should be noted that avalanche photo diodes, which are widely used in optical fiber communication, are also applicable to the filter films for replacing filter lenses of prior arts. In comparison with PIN photo diodes, under a same optical power, the avalanche photo diodes have higher gains of electron-hole pairs. Therefore, in a thermal noise system, avalanche photo diodes perform a higher signal to noise ratio and provide a longer distance of transmission. However, in a shot noise system, avalanche photo diodes get a worse signal to noise ratio and less distance of transmission.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical receiver for transforming optical signals into electric current, comprising:
   a photo diode having a sensitization area for receiving said optical signals;
   an anti-reflection film covering said sensitization area;
   at least a filter film, covering a surface of said anti-reflection film and allowing a light of a specific frequency range to go through; and
   a metal contact located on sides of the anti-reflection film and the filter film;
   wherein the optical receiver is free of a filter lens.

2. The optical receiver according to claim 1, wherein said photo diode is a PIN photo diode or an avalanche photo diode.

3. The optical receiver according to claim 1, wherein said filter film is located on a P-region, an intrinsic region, or an N-region of a PIN photo diode. photo diode 4. The optical receiver of claim 1, further comprising a silicon dioxide layer located between the metal contact and an intrinsic region.

5. A light-receiving device, comprising:
   a transimpedance amplifier for transforming an electric current into voltage signals;
   a limiting amplifier for providing a low/high threshold to said voltage signals; and
   an optical receiver, which comprises:
   a photo diode having a sensitization area for receiving a light and transforming into said electric current;
   an anti-reflection film covering said sensitization area;
   at least a filter film, covering a surface of said anti-reflection film and allowing light of a specific frequency range to go through; and
   a metal contact located on sides of the anti-reflection film and the filter film.

6. The optical receiver device according to claim 5 wherein said photo diode is a PIN photo diode or an avalanche photo diode.

7. The optical receiver device according to claim 5 wherein said filter film is located on a P-region, an intrinsic region, or an N-region of a PIN photo diode.

8. An optical transceiver module, comprising:
   a light-emitting device having a laser diode and a laser diode driver; and
   a light-receiving device having an optical receiver, a transimpedance amplifier and a limiting amplifier;
   wherein said optical receiver comprises:
   a photo diode having a sensitization area for receiving a light and transforming into an electric current;
   an anti-reflection film covering said sensitization area;
   at least a filter film, covering a surface of said anti-reflection film and allowing light of a specific frequency range to go through; and
   a metal contact located on sides of the anti-reflection film and the filter film.

9. The optical transceiver module according to claim 8 wherein said photo diode is a PIN photo diode.

10. The optical transceiver module according to claim 8 wherein said filter film is located on a P-region, an intrinsic region, or an N-region of a PIN photo diode.

11. The optical transceiver module according to claim 8 wherein said photo diode is an avalanche photo diode.

12. The optical transceiver module of claim 8, further comprising a silicon dioxide layer located between the metal contact and an intrinsic region.

13. An optical receiver for transforming optical signals into electric current, comprising:
   a photo diode having a sensitization area for receiving said optical signals;
   at least a filter film, covering a surface of said sensitization area and allowing a light of a specific frequency range to go through;
   an anti-reflection film covers the surface of said filter film; and
   a metal contact located on sides of the anti-reflection film and the filter film;
   wherein the optical receiver is free of a filter lens.

14. The optical receiver according to claim 13 wherein said photo diode is a PIN photo diode or an avalanche phot diode.

15. The optical receiver according to claim 13 wherein said filter film is located on a P-region, an intrinsic region, or an N-region of a PIN photo diode.

16. The optical receiver of claim 13, further comprising a silicon dioxide layer located between the metal contact and an intrinsic region.

17. An optical transceiver module, comprising:
   a light-emitting device having a laser diode and a laser diode driver; and
   a light-receiving device having an optical receiver, a transimpedance amplifier and a limiting amplifier;
   wherein said optical receiver comprises:
   a photo diode having a sensitization area for receiving a light and transforming into an electric current;
   at least a filter film, covering a surface of said sensitization area and allowing a light of a specific frequency range to go through;

an anti-reflection film covering the surface of said filter film; and a metal contact located on sides of the anti-reflection film and the filter film.

18. The optical transceiver module according to claim 17 wherein said photo diode is a PIN photo diode or an avalanche photo diode.

19. The optical transceiver module according to claim 17 wherein said filter film is located on a P-region, an intrinsic region, or an N-region of a PIN photo diode.

20. The optical transceiver module of claim 17, further comprising a silicon dioxide layer located between the metal contact and an intrinsic region.

* * * * *